United States Patent
Hiatt et al.

(10) Patent No.: US 6,881,264 B2
(45) Date of Patent: Apr. 19, 2005

(54) CONFIGURATION AND A METHOD FOR REDUCING CONTAMINATION WITH PARTICLES ON A SUBSTRATE IN A PROCESS TOOL

(75) Inventors: Mark Hiatt, Eagle, ID (US); Karl Mautz, Austin, TX (US); Ralf Schuster, Dresden (DE)

(73) Assignees: Infineon Technologies AG, Munich (DE); Infineon Technologies SC300 GmbH, Dresden (DE); Motorola Inc., Schaumburg, IL (US)

( * ) Notice: Subject to any disclaimer, the term of this patent is extended or adjusted under 35 U.S.C. 154(b) by 48 days.

(21) Appl. No.: 10/643,820

(22) Filed: Aug. 19, 2003

(65) Prior Publication Data

US 2004/0154530 A1 Aug. 12, 2004

Related U.S. Application Data

(63) Continuation of application No. PCT/EP02/01408, filed on Feb. 11, 2002.

(30) Foreign Application Priority Data

Feb. 19, 2001 (EP) .............................................. 01103989

(51) Int. Cl.$^7$ ........................... B05C 11/06; B05C 11/02
(52) U.S. Cl. ........................... 118/63; 118/52; 118/612; 118/50; 118/62; 396/611; 427/294; 427/240
(58) Field of Search ............................. 118/52, 612, 50, 118/62, 63, 66, 313; 396/611, 612; 427/294, 240, 425

(56) References Cited

U.S. PATENT DOCUMENTS

| | | | |
|---|---|---|---|
| 5,213,650 A | 5/1993 | Wang et al. | |
| 5,529,626 A | * 6/1996 | Stewart | 118/500 |
| 5,626,675 A | 5/1997 | Sakamoto et al. | |
| 5,966,635 A | 10/1999 | Hiatt et al. | |
| 6,033,135 A | 3/2000 | An et al. | |
| 6,136,163 A | * 10/2000 | Cheung et al. | 204/198 |
| 6,499,333 B1 | * 12/2002 | Ko et al. | 73/1.01 |

FOREIGN PATENT DOCUMENTS

| | | |
|---|---|---|
| JP | 06216018 | 8/1994 |
| JP | 09139375 | 5/1997 |
| TW | 408368 | 10/2000 |
| WO | 01/03165 A1 | 1/2001 |

* cited by examiner

*Primary Examiner*—Chris Fiorilla
*Assistant Examiner*—Yewebdar Tadesse
(74) *Attorney, Agent, or Firm*—Laurence A. Greenberg; Werner H. Stemer; Ralph E. Locher

(57) ABSTRACT

A process tool, preferably a spin coater, includes a set of at least three arms and an adjustable rinse nozzle. The arms lift a substrate, e.g. a semiconductor wafer, from a chuck inside the process chamber after having performed the corresponding manufacturing step, e.g. coating. The contact area between the arms and the substrate is as small as possible. The rinse nozzle dispenses a solvent liquid onto the backside of the substrate, thereby removing contaminating particles located at the area of contact between the vacuum channels of the chuck and the substrate. The set of arms rotates for a homogeneous cleaning. A gas flowing out of vacuum ports of the chuck prevents the vacuum ports from being obstructed with particles. While the substrate is being lifted, the chuck can also be cleaned by dispensing the solvent liquid onto the chuck.

11 Claims, 2 Drawing Sheets

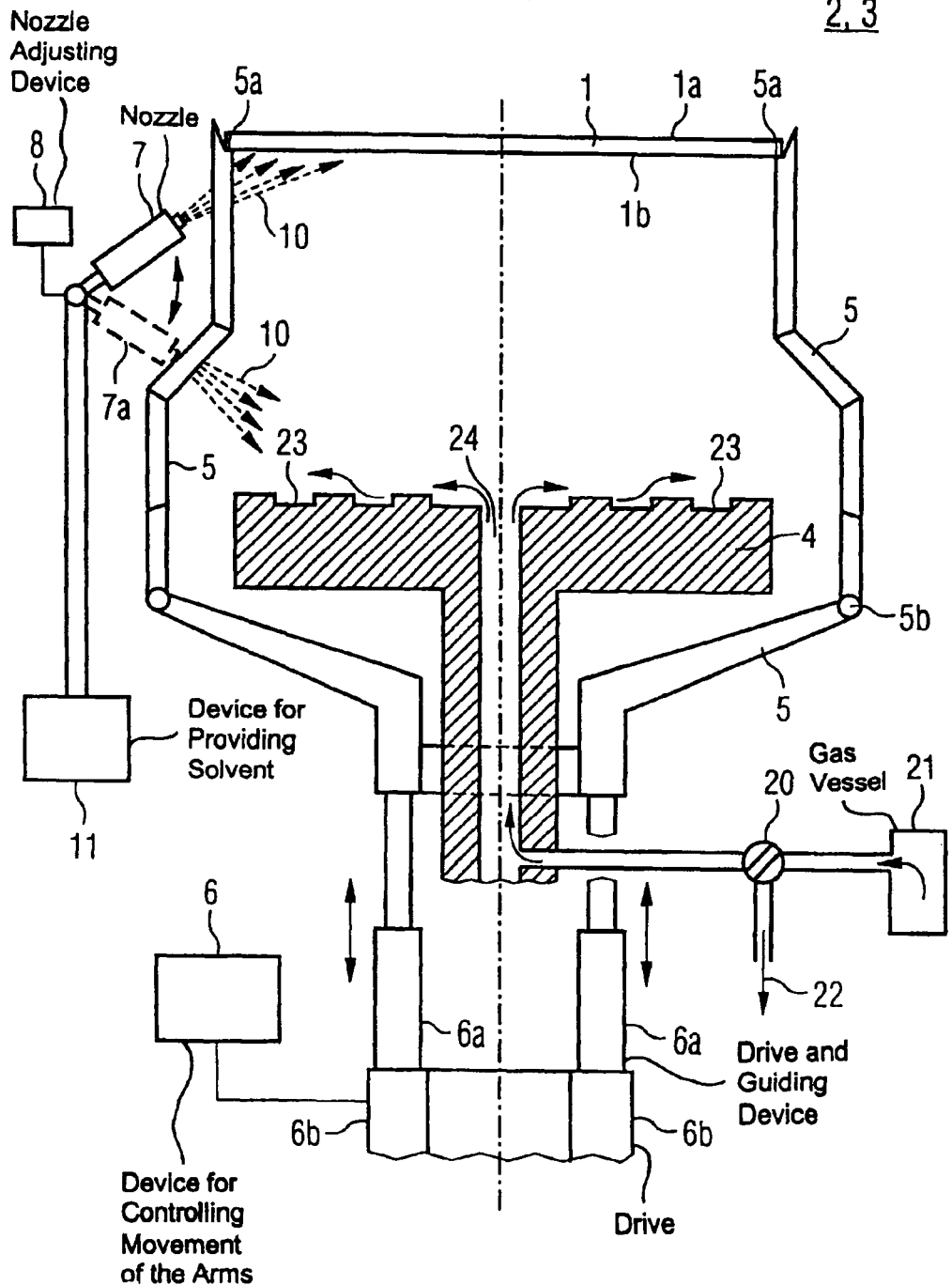

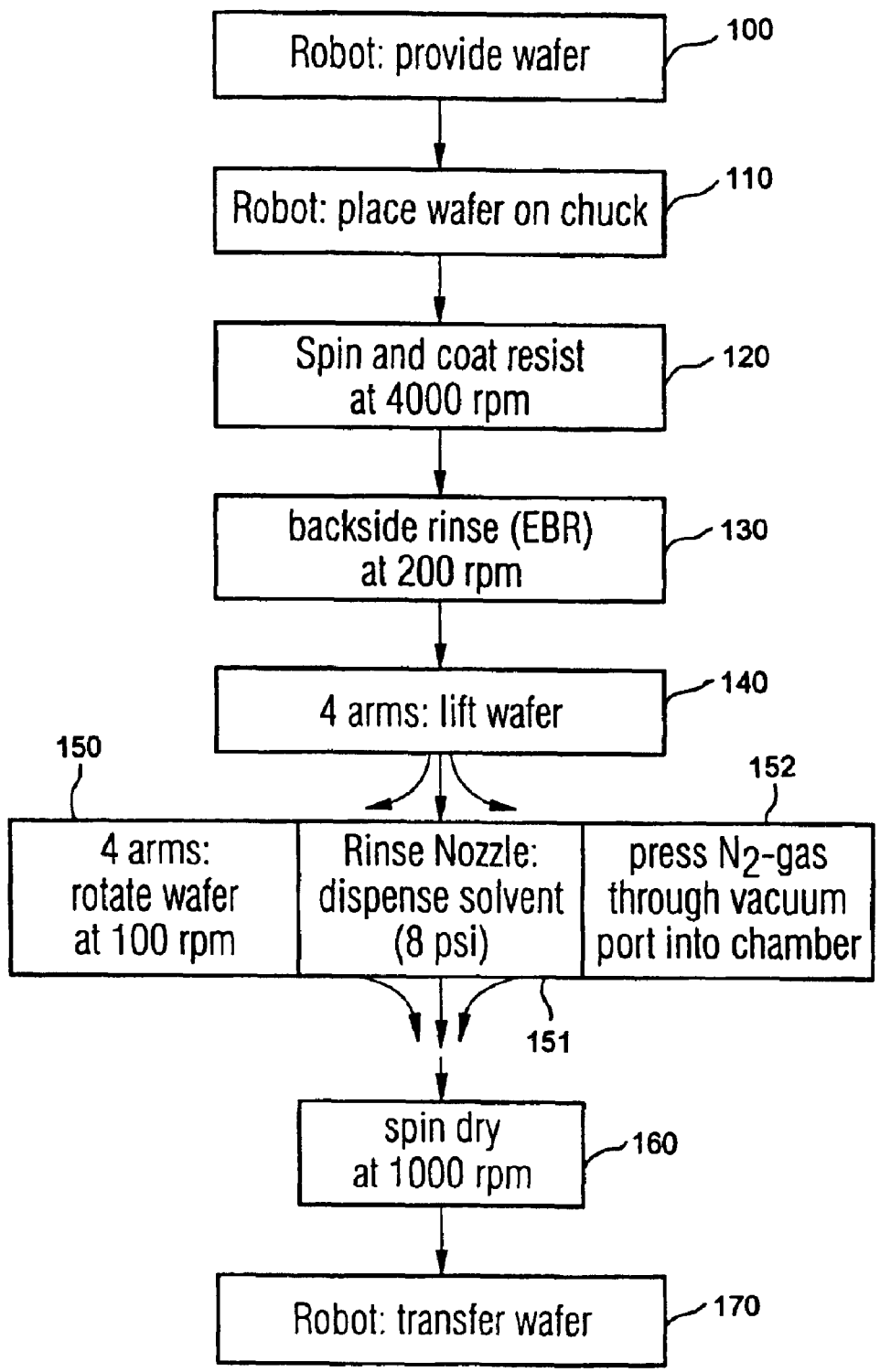

CONFIGURATION AND A METHOD FOR REDUCING CONTAMINATION WITH PARTICLES ON A SUBSTRATE IN A PROCESS TOOL

CROSS-REFERENCE TO RELATED APPLICATION

This application is a continuation of copending International Application No. PCT/EP02/01408, filed Feb. 11, 2002, which designated the United States and was published in English.

BACKGROUND OF THE INVENTION

Field of the Invention

The present invention relates to a configuration and a method for reducing particle contamination on a substrate in a process tool. The substrate has a backside that is orientated towards a chuck.

In semiconductor device manufacturing several processing steps have to be performed until a substrate has received the desired structure of an integrated circuit. In many cases the corresponding equipment includes a process chamber with a chuck inside, upon which the semiconductor device, e.g. a semiconductor wafer, can be laid in order to experience an actual processing step. Despite restrictive cleanroom specifications, problems due to particle contamination often arise due to mechanical interactions between the semiconductor devices and the chucks during the handling, and due to physical or chemical by-products of the current process. While particles assembling irregularly on the frontside of the semiconductor device can cause defects on the final integrated circuit, also particles accumulating on the backside of the semiconductor device can lead to severe problems in subsequent processing steps. Once particles have accumulated on the device backside, the device is warped when placed on the chuck of the next process step since the particles are locked between the plane backside of the device and the chuck surface. In particular, the lithographic step then suffers from non-linear warpage of up to 100 nm in the lateral direction, and from focus depth variation across the device.

In the case when the semiconductor device is a wafer, the process track prior to the lithographic step usually includes a hot plate, followed by a spin coater and a further hot plate for pre-backing the resist dispensed on the wafer during the coating step. Of these steps prior to wafer exposure, the coating step represents a main contributor of generated particles that accumulate on the wafer backside. This is due to resist material that is removed from the wafer surface during the spinning movement when the wafer is coated, which then by the airflow, may gather as particles on the wafer backside or is deposited on the chuck after the wafer has been removed from the process chamber, i.e. the spinner cup. The following wafer that will be processed is then placed on the contaminated chuck and the particles stick to the wafer backside.

In order to hold and fix the wafer during spinning with a rate of up to 5000 rpm, vacuum channels are distributed on the chuck surface and are connected to a vacuum port. This further leads to a stronger mechanical interaction between the wafer and the chuck due to the underpressure in the vacuum channels. The particles mainly gather inside these channels beneath the wafer and then eventually stick to the wafer backside in concentrated areas, i.e. a contact area between the wafer backside and the vacuum channels.

Several techniques have been proposed to circumvent the problem of backside particle contamination. One prior art solution is to direct a solvent to the edge of the device for removing the resist where it is not needed and where it could cause the generation of particles in subsequent steps. Since, e.g., 200 mm wafers have a diameter that is slightly larger than the chuck, the edge parts of the backside are often cleaned by the solvent as well. But, because most of the wafer backside is contacting the chuck, few contaminating particles can be removed from the backside using this technique.

Another prior art method for reducing particle contamination is to position those backside areas, which are contaminated on a chuck during a first process step, e.g. coating, onto the position of the vacuum channels on a chuck of subsequent step, e.g. lithography. While warpage could effectively be reduced, it is not easy to forecast the contaminated areas correctly using, e.g., optical inspection. Additionally, the corresponding chuck designs have to be the same.

U.S. Pat. No. 5,966,635 teaches cleaning chucks between two processing steps of a wafer by applying a solvent liquid to the chuck to remove particles from the chuck. The removed particles then cannot stick to the backside of the next wafer to be processed. Although particles cannot accumulate in the process chamber and on the chuck, particles are still able to move to the backside of the wafer within a process step, where most of the particles are generated. Once a particle has entered the vacuum channels it can further be transported beneath the wafer.

A still further technique, which is commonly applied to wafers having a diameter of 300 mm, is to reduce the contact area of the vacuum chuck with the wafer. A typically used chuck-wafer back support area for chucks today is about 50% of the wafer backside area. Applying a solvent liquid through an edge bead removal nozzle to the backside of the wafer therefore is able to clean about half of the wafer backside area, while the central parts remain contaminated. A main disadvantage of this solution is that 300 mm-wafers start to vibrate in normal modes at rotation frequencies that have commonly been used. The resist that is dispensed onto the wafer during spinning at about 5000 rpm then is not homogeneously distributed on the wafer frontside surface. Rather, it forms wavelike thickness structures due to mechanical interference effects at the outer unsupported surface area, i.e. where the wafer backside does not have contact with the chuck.

For this reason, the rotation speed of a spin coater is typically reduced to about 2000 rpm in the 300 mm case. Because of this, it becomes difficult to process a larger thickness of the resist with a given viscosity resulting in a reduced process quality for the lithographic step.

SUMMARY OF THE INVENTION

It is accordingly an object of the invention to provide a configuration for reducing particle contamination on a substrate configured on a chuck in a process chamber of a process tool and a method for reducing particle contamination on a substrate configured on a chuck in a process chamber of a process tool, which overcome the abovementioned disadvantages of the prior art apparatus and methods of this general type.

It is therefore a primary objective of the present invention to reduce particle contamination in semiconductor device manufacturing in order to improve the process conditions for subsequent manufacturing steps.

With the foregoing and other objects in view there is provided, in accordance with the invention, a configuration for reducing particle contamination on the substrate. The configuration is used in combination with a process chamber designed for performing a processing step for a substrate. The configuration includes a chuck for receiving a backside of the substrate. The chuck is configured inside the process chamber. The chuck is formed with a vacuum port and a plurality of vacuum channels for fixing the substrate. The plurality of vacuum channels are connected to the vacuum port. The configuration also includes a set of at least three movable arms for lifting the substrate from the chuck. Each of the arms has a tapered shelf. The configuration also includes a device for controlling movement of the arms. The device for controlling movement of the arms includes a drive. The configuration also includes: at least one rinse nozzle for dispensing a solvent liquid; a device for supplying the solvent liquid to the rinse nozzle; a first source of gas pressure for providing a first gas pressure smaller than a gas pressure of the process chamber for providing nearly vacuum conditions; a second source of gas pressure for providing a second gas pressure larger than the gas pressure of the process chamber for providing a neutral gas to the plurality of vacuum channels; and a switching device having a first switched state for applying the first gas pressure to the vacuum port and a second switched state for applying the second gas pressure to the vacuum port.

According to the present invention, a set of arms is provided inside the process chamber of a process tool. The set of arms lifts the semiconductor device from the chuck after the semiconductor device has been processed so that the semiconductor device can be cleaned by applying a solvent liquid through a rinse nozzle onto the backside of the semiconductor device. The invention can advantageously be applied in particular to a coating track prior to exposing, e.g., a wafer. The process tool is a spin coater, but any other process tool for CMP (chemical mechanically polishing), etching, etc. can be incorporated into the configuration and the method of the present invention. In addition, any other suitable semiconductor device or substrate like masks and reticles, flat panel displays, etc. can be incorporated into the configuration and the method of the present invention.

After having cleaned the semiconductor device backside, the device can either be lifted down again onto the chuck in order to be transferred to the next process step by a robot, or it can be directly transferred from the set of arms to the robot arms of a track automation system. The arms of the configuration include tapered shelves for providing a smallest possible contact area with the semiconductor device, and can have the form of knife edges. The contact area, i.e. the position where the arms contact and hold the substrate, is preferably located at the substrate edge, because this can be cleaned by the conventional etch bead removal nozzle. The arms are constructed, such that they lift the device from beneath. The device is then supported by at least three arms in order to retrieve a stable position.

The preferable number of supporting arms, or pins, is three to five. The arms have to be moved in at least a vertical direction in order to lift the device. Optional joints enable the arms to adjust to different substrate sizes or to clamp the substrate. All arms can have individual drives having coordinated movements controlled by a control unit, or the arms can be raised and lowered by one common drive. The arms can be based on a moveable socket either beneath or above the chuck position in the process chamber. In the case of such a top-position, additional drives and joints are necessary to lead the arms around the substrate from the top for supporting the substrate from its backside. The backside is orientated towards the chuck, i.e. commonly the bottom direction. After the contact has been established, the device can be lifted.

Preferably, the substrate is fixed in a stable position lying on the at least three supporting arms. The substrate is just held by gravity. Additionally, a clamping mechanism for the arms can be provided. The clamping mechanism applies a force that acts on the substrate edges towards the substrate center without contacting the frontside of the substrate that is covered by the resist in case when the process tool is a spin coater.

The material used for the arms can be any neutral material like steel or teflon, etc. In a further aspect, the at least three movable arms can be rotated around an axis in order to access all parts of the substrate backside homogeneously with the solvent liquid through the rinse nozzle. In a preferred embodiment, the rotational axis is the same as that of the chuck. The substrate needs to be clamped by the arms when being rotated in order not to be damaged by sliding down because of the centrifugal force in connection with a slight off-center position of the substrate. The rotation speed for arm rotation when dispensing the solvent liquid onto the substrate backside should not be in excess of the spin-dry rotation speed, which is typically in the magnitude of 1000 rpm. Preferred rotation speeds are in the range of 50–300 rpm.

At least one rinse nozzle is provided to clean the backside of the substrate. The rinse nozzle is connected to a source of solvent liquid, which can be dispensed with a pressure of 3–10 psi through the nozzle onto the backside. For the solvent liquid PGMEA (propylene glycol monomethyl ether acetate), EGMEA (ethylene glycol monoethyl ether acetate), or any other common solvent liquid can be used. If the set of arms is not able to rotate, two rinse nozzles should preferably be employed to cover the whole substrate backside with the solvent liquid. In a further aspect, at least one rinse nozzle can be controlled to move, such that the accessibility of the device backside is advantageously further improved.

The horizontal height level of the nozzle is beneath the lift-up position of the substrate, i.e. the top-most position of the tapered shelves of the arms contacting the substrate. In this position, the substrate backside can be accessed by the solvent liquid that is applied through the rinse nozzle. Furthermore, the rinse nozzle has a height above the chuck surface level, and—by means of a drive for changing the nozzle position and/or direction—in a further aspect, the rinse nozzle can be directed towards the chuck surface in order to dispense the solvent liquid onto the chuck surface to remove contaminating particles therefrom.

In a further aspect, the contamination of the vacuum channels or vacuum ports of the chuck is considered. In order to impede a deposition of particles inside the vacuum channels or ports, gas can be directed out of the vacuum port and through the vacuum channels with a higher pressure than the pressure in the process chamber. For this, $N_2$-gas or any other neutral gas can be utilized, e.g. helium. A switch is used to either apply the vacuum to the vacuum port for sucking the substrate onto the chuck surface via the vacuum channels, or directing the gas out off the vacuum port in order to keep the vacuum channels clean.

In accordance with an added mode of the invention, the method further includes, while holding the substrate with the set of the arms, using a rotating device to rotate the substrate in order to access substrate-arm-contact areas with the solvent liquid based on an Bernoulli-effect.

Other features which are considered as characteristic for the invention are set forth in the appended claims.

Although the invention is illustrated and described herein as embodied in a configuration and a method for reducing contamination with particles on a substrate in a process tool, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a side view of a configuration inside the process chamber of a spin coater; and FIG. 2 is a flow chart of a coating process using an embodiment of the inventive method.

DESCRIPTION OF THE PREFERRED EMBODIMENTS

Referring now to the figures of the drawing in detail and first, particularly, to FIG. 1 thereof, there is shown a process chamber 3 of a spin coater 2. Inside the process chamber 3, a set of four arms 5 is mounted on a rotatable drive and a guiding device 6a for vertical arm movement. The rotation axis of a drive and guiding device 6a is the same as that of a spin coater chuck 4 for holding the semiconductor wafer 1 during processing. As can be seen in FIG. 1, the drive and guiding device 6a for vertical arm movement is controlled by a device 6 for controlling the movement of the arms 5 in order to lift the semiconductor wafer 1 from the chuck 4 such that the semiconductor wafer backside 1b and the surface of the chuck 4 are freely accessible by a solvent liquid 10 through a rinse nozzle 7. By way of joints 5b for horizontal arm movement, the arms 5 can be adjusted to the size of the semiconductor wafer 1 such that the wafer 1 can be properly clamped into the tapered shelves 5a at the ends of the arms 5. The device 6 for controlling the movement of the arms 5 includes a control unit that is connected to the automation system controlling the coating process. In particular the lifting of the arms 5 by the drive and guiding device 6a, the clamping by joints 5b with respective drives, and the rotation of the set of arms 5 by bearings and a drive 6b are put into a time sequence according to a complete coating track process.

In the lift-up position of the set of arms 5, a rinse nozzle 7 can dispense solvent liquid 10 onto the wafer backside 1b, since the height level of the rinse nozzle 7 is beneath the lift-up position of the arms 5 with the tapered shelves 5a holding the wafer 1. Contaminating particles can then be advantageously removed from the wafer backside 1b. Additionally, an adjusting device 8 for adjusting the direction of the rinse nozzle 7 can switch the direction of the rinse nozzle 7 into a rinse nozzle chuck cleaning position 7a for dispensing the solvent liquid 10 onto the chuck surface. The solvent liquid 10 is supplied by an external device 11 for providing the solvent liquid.

The chuck 4 includes vacuum channels 23 connected to a vacuum port 24 for sucking the semiconductor wafer 1 to the chuck surface when being spun and processed. In the configuration of FIG. 1, the wafer backside 1b is cleaned with solvent liquid, such that the vacuum channels 23 can be contaminated with the particles that are removed from the wafer backside 1b. Therefore a switching device, namely the switch 20, disconnects the vacuum port 24 from a source of vacuum 22 and connects the vacuum port 24 to a gas vessel 21 containing $N_2$-gas with a higher pressure than the pressure in the process chamber 3, so that the nitrogen gas flows via the vacuum port 24 through the vacuum channels 23, thereby preventing particles from settling down in the vacuum channels 23.

An embodiment of a sequence of steps for reducing particle contamination on a substrate is shown in FIG. 2. The configuration used is the same as explained immediately above. A robot of the track automation system for coating a wafer provides the wafer 1 to the spin coater 2 (step 100) and places the wafer 1 on the chuck 4 (step 110). An organic resist is dispensed on the wafer frontside 1a where the wafer with a diameter of 300 mm is spun at 4000 rpm (revolutions per minute) (step 120). The chuck 4 has a diameter of 290 mm. After the coating, a conventional backside rinse using an edge bead rinse nozzle is performed on the edge of the wafer 1, which is exposed beyond the chuck while the chuck rotates with 200 rpm (step 130). For clarity, a resist dispense nozzle, the edge bead rinse nozzle and a spin cup enclosing the process chamber 2 are not shown in the embodiment of FIG. 1. The backside rinse is an optional step and need not be performed according to the present invention.

Thereafter, using the device 6 for controlling the movement of the arms, the arms 5 are lifted and the tapered shelves 5a, which contact the wafer 1, lift the wafer 1 up to a lift-up position (step 140). This is followed by three processes running in parallel: while the four arms rotate the wafer at 100 rpm (step 150), the rinse nozzle dispenses the solvent liquid with a pressure of 8 psi onto the wafer backside 1b (step 151), and switch 20 is opened to release $N_2$-gas from the vessel 21. The $N_2$-gas travels through the vacuum port 24 and through the vacuum channels 23 (step 152) for removing particles on the backside 1b of the wafer 1 that were generated in the cleaning process. Moreover, resist particles that are suspended in the airflow originating from the spinning and coating step, which may move towards the chuck are also prevented from settling down into the vacuum channels 23.

After the cleaning step, the wafer 1 is spun dry while being held on the arms 5 at the rotation speed of 1000 rpm (step 160), and is finally handed over to the robot arms, which transfers the wafer 1 (step 170) to the next process step.

In a similar embodiment, the wafer 1 can be placed onto the chuck 4 again (lift-down position) after the cleaning step, spun dry on the chuck, and then followed by the robot transfer step.

In a still further embodiment, the wafer backside cleaning step can be followed by a chuck surface cleaning step by switching the rinse nozzle 7 in a chuck cleaning position 7a, then dispensing solvent liquid, and then continuing with the steps of the previous embodiment.

We claim:

1. In combination with a process chamber designed for performing a processing step for a substrate, a configuration for reducing particle contamination on said substrate, the configuration comprising:

a chuck for receiving a backside of said substrate, said chuck configured inside said process chamber, said chuck formed with a vacuum port and a plurality of vacuum channels for fixing said substrate, said plurality of vacuum channels connected to said vacuum port;

a set of at least three movable arms for lifting said substrate from said chuck, each of said arms having a tapered shelf;

a device for controlling movement of said arms, said device for controlling movement of said arms including a drive;

at least one rinse nozzle for dispensing a solvent liquid;

a device for supplying said solvent liquid to said at least one rinse nozzle;

a first source of gas pressure for providing a first gas pressure smaller than a gas pressure of said process chamber for providing nearly vacuum conditions;

a second source of gas pressure for providing a second gas pressure larger than said gas pressure of said process chamber for providing a neutral gas to said plurality of vacuum channels; and a switching device having a first switched state for applying said first gas pressure to said vacuum port and a second switched state for applying said second gas pressure to said vacuum port.

2. The combination according to claim 1, wherein: said process chamber is part of a process tool;

said process tool is a spin coater that has a device for dispensing a resist on a frontside of said substrate;

said frontside of said substrate is opposite said backside of said substrate; and said chuck is designed to rotate around an axis.

3. The combination according to claim 2, wherein said set of arms is mounted for rotation around said axis.

4. The combination according to claim 2, also in combination with said substrate, wherein said substrate is a semiconductor wafer having a diameter of at least 300 millimeters, and said chuck has a contact surface with a diameter of at least 280 millimeters.

5. The combination according to claim 4, further comprising:

an adjusting device;

said chuck having a contact surface; and said adjusting device for adjusting a position and direction of said at least one rinse nozzle for applying said solvent liquid to said backside of said wafer while said wafer is being lifted by said set of arms and for applying said solvent liquid to said contact surface of said chuck.

6. The combination according to claim 5, wherein said adjusting device can be adjusted to apply said solvent liquid to said plurality of vacuum channels of said chuck.

7. A method for reducing a number of particles on a substrate in a process tool, the method which comprises:

providing the process tool according to claim 1;

loading the substrate onto the chuck such that a backside of the substrate is oriented towards the chuck;

processing the substrate;

lifting the substrate from the chuck using the set of at least three arms;

dispensing a solvent liquid onto the backside of the substrate using the at least one rinse nozzle, while directing gas out of at least one vacuum port formed on the chuck in order to protect the vacuum port from being contaminated with particles; and unloading the substrate from the chuck.

8. The method according to claim 7, which further comprises holding the substrate with the set of arms and rotating the set of arms around an axis while performing the step of dispensing the solvent liquid.

9. The method according to claim 8, which further comprises dispensing the solvent liquid onto the chuck after performing the step of lifting the substrate.

10. The method according to claim 7, which further comprises while holding the substrate with the set of the arms, using a rotating device to rotate the substrate in order to access substrate-arm-contact areas with the solvent liquid.

11. The method according to claim 7, which further comprises while holding the substrate with the set of the arms, using a rotating device to rotate the substrate in order to access substrate-arm-contact areas with the solvent liquid based on an Bernoulli-effect.

* * * * *